United States Patent
Oh et al.

(10) Patent No.: US 7,772,600 B2
(45) Date of Patent: Aug. 10, 2010

(54) LIGHT EMITTING DEVICE HAVING ZENER DIODE THEREIN AND METHOD OF FABRICATING THE SAME

(75) Inventors: Duck Hwan Oh, Suwon-si (KR); Sang Joon Lee, Seoul (KR); Kyung Hae Kim, Seoul (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 201 days.

(21) Appl. No.: 12/090,053

(22) PCT Filed: Mar. 20, 2007

(86) PCT No.: PCT/KR2007/001348

§ 371 (c)(1),
(2), (4) Date: May 8, 2008

(87) PCT Pub. No.: WO2007/111432

PCT Pub. Date: Oct. 4, 2007

(65) Prior Publication Data

US 2008/0265272 A1    Oct. 30, 2008

(30) Foreign Application Priority Data

Mar. 28, 2006   (KR) ...................... 10-2006-0027725
Mar. 28, 2006   (KR) ...................... 10-2006-0027726
Mar. 30, 2006   (KR) ...................... 10-2006-0028771

(51) Int. Cl.
*H01L 27/15*    (2006.01)
(52) U.S. Cl. .................. 257/86; 257/103; 257/106; 257/199; 257/603; 257/E21.355; 438/22; 438/91; 438/983

(58) Field of Classification Search ............... 257/13, 257/79–103, 603, 918, E25.032, 106, 199, 257/E21.355; 438/22, 91, 983, FOR. 157
See application file for complete search history.

(56) References Cited

U.S. PATENT DOCUMENTS 6,593,597 B2    7/2003   Sheu et al.

(Continued)

FOREIGN PATENT DOCUMENTS

JP    10-256610    9/1998

(Continued)

*Primary Examiner*—Evan Pert
*Assistant Examiner*—Scott R Wilson
(74) *Attorney, Agent, or Firm*—H.C. Park & Associates, PLC (57) ABSTRACT

Disclosed are a light emitting device having a zener diode therein and a method of fabricating the light emitting device. The light emitting device comprises a P-type silicon substrate having a zener diode region and a light emitting diode region. A first N-type compound semiconductor layer is contacted to the zener diode region of the P-type silicon substrate to exhibit characteristics of a zener diode together with the P-type silicon substrate. Further, a second N-type compound semiconductor layer is positioned on the light emitting diode region of the P-type silicon substrate. The second N-type compound semiconductor layer is spaced apart from the first N-type compound semiconductor layer. Meanwhile, a P-type compound semiconductor layer is positioned on the second N-type compound semiconductor layer, and an active layer is interposed between the second N-type compound semiconductor layer and the P-type compound semiconductor layer.

20 Claims, 3 Drawing Sheets

U.S. PATENT DOCUMENTS

| | | | |
|---|---|---|---|
| 2005/0271107 A1* | 12/2005 | Murakami et al. | 372/50.1 |
| 2007/0131951 A1* | 6/2007 | Ikemoto et al. | 257/94 |
| 2007/0254394 A1* | 11/2007 | Seo et al. | 438/39 |
| 2008/0291784 A1* | 11/2008 | Yamanaka et al. | 367/99 |

FOREIGN PATENT DOCUMENTS

| | | |
|---|---|---|
| JP | 2001-015815 | 1/2001 |
| KR | 10-2005-0045318 | 5/2005 |

\* cited by examiner

LIGHT EMITTING DEVICE HAVING ZENER DIODE THEREIN AND METHOD OF FABRICATING THE SAME

CROSS REFERENCE RELATED APPLICATIONS

This application is the National Stage of International Application No. PCT/KR2007/001348, filed on Mar. 20, 2007, and claims priority from and the benefit of Korean Patent Application No. 10-2006-0027725, filed on Mar. 28, 2006, Korean Patent Application No. 10-2006-0027726, filed on Mar. 28, 2006, and Korean Patent Application No. 10-2006-0028771, filed on Mar. 30, 2006, which are all hereby incorporated by reference for all purposes as if fully set forth herein.

BACKGROUND OF THE INVENTION

1. Field of the Invention

The present invention relates to a light emitting device and a method of fabricating the same, and more particularly, to a light emitting device having a zener diode therein and a method of fabricating the light emitting device.

2. Discussion of the Background

A light emitting diode is an electroluminescence device that emits light using a forward current. Compound semiconductors, such as InP, GaAs and GaP, have been used as materials of light emitting diodes that emit red or green light. GaN-based compound semiconductors have been developed and used as materials of light emitting diodes that emit ultra violet rays and blue light.

Light emitting diodes have been widely used for various kinds of displays, backlights and the like. Recently, there have been developed techniques for emitting white light by utilizing three light emitting diode chips respectively emitting red, green and blue light or by converting a wavelength using phosphors. Thus, the applications of the light emitting diodes are expanded even to illumination apparatuses.

Generally, a GaN-based compound semiconductor is epitaxially grown on a sapphire substrate of which a crystal structure and a lattice coefficient are similar to those of the GaN-based compound semiconductor, in order to reduce the occurrence of a crystal defect. Since sapphire is an insulating material, electrode pads of a light emitting diode are formed on a growth surface of an epitaxial layer. However, in a case where a substrate made of an insulating material such as sapphire is used, it is difficult to prevent electrostatic discharge due to static electricity introduced from the outside of the light emitting diode, and thus, a diode may be easily damaged, resulting in deterioration of the reliability of the device. Therefore, when packaging a light emitting diode, an additional zener diode is mounted and used together with the light emitting diode in order to prevent electrostatic discharge. However, since a zener diode is expensive and processes of mounting the zener diode are added, the number of processes of packaging a light emitting diode and fabrication costs thereof are increased.

Further, since sapphire has low thermal conductivity, it cannot easily dissipate heat produced from a light emitting diode to the outside. Such low heat dissipation performance makes it difficult to apply light emitting diodes to a field in which a high luminous power is required.

Meanwhile, a transparent electrode layer is generally formed to supply a current to a light emitting diode. Although Ni/Au or ITO transparent electrode layer is generally used, the thickness of each of the transparent electrode layers is limited to about 0.005 to 0.2 μm due to limitations on their light transmission properties. Such a thickness limitation makes it difficult to variously design the configuration of the transparent electrode layer. As a result, it is difficult to obtain uniform light distribution.

SUMMARY OF THE INVENTION

An object of the present invention is to provide a light emitting device having a light emitting diode and a zener diode in a single chip.

Another object of the present invention is to provide a light emitting device capable of achieving a high luminous power using a substrate with superior heat dissipation performance.

A further object of the present invention is to provide a light emitting device employing a transparent electrode layer of which the configuration can be designed variously, and a method of fabricating the light emitting device.

To achieve these objects, the present invention provides a light emitting device having a zener diode therein and a method of fabricating the light emitting device. A light emitting device according to an aspect of the present invention comprises a P-type silicon substrate having a zener diode region and a light emitting diode region. A first N-type compound semiconductor layer is contacted to the zener diode region of the P-type silicon substrate to exhibit characteristics of a zener diode together with the P-type silicon substrate. Further, a second N-type compound semiconductor layer is positioned on the light emitting diode region of the P-type silicon substrate. The second N-type compound semiconductor layer is spaced apart from the first N-type compound semiconductor layer. Meanwhile, a P-type compound semiconductor layer is positioned on the second N-type compound semiconductor layer, and an active layer is interposed between the second N-type compound semiconductor layer and the P-type compound semiconductor layer. Accordingly, it is possible to provide a light emitting device having a zener diode including the P-type silicon substrate and the first N-type compound semiconductor layer, and a light emitting diode including the second N-type compound semiconductor layer, the active layer and the P-type compound semiconductor layer in a single chip, so that damage to the light emitting diode due to electrostatic discharge can be prevented. It is possible to provide a light emitting device with superior heat dissipation performance by employing a silicon substrate.

The silicon substrate may be a porous silicon substrate. The heat dissipation performance of the light emitting device can be more enhanced by employing the porous silicon substrate.

The porous silicon substrate may be a substrate of which at least one surface has a porous silicon layer. The first and second N-type compound semiconductor layers are formed on the porous silicon layer.

Meanwhile, the first and second N-type compound semiconductor layers may be formed from an identical N-type compound semiconductor layer grown on the P-type silicon substrate. Accordingly, since the first and second N-type compound semiconductor layers may be formed using an identical process, the process of fabricating a light emitting device can be prevented from being complicated.

Meanwhile, the P-type compound semiconductor layer may be positioned on one region of the second N-type compound semiconductor layer, and the other region thereof may be exposed. Accordingly, it is possible to form electrode pads with various combinations.

Meanwhile, a transparent electrode layer may be positioned on the P-type compound semiconductor layer. Further, electrode pads may be formed on the first and second N-type compound semiconductor layers and the transparent electrode layer, respectively.

The transparent electrode layer may be formed of indium tin oxide (ITO) or Ni/Au. Alternatively, the transparent electrode layer may be formed of ZnO. The transparent electrode layer can be formed to be thick by employing the ZnO transparent electrode layer, so that the configuration of the transparent electrode layer can be variously designed. Particularly, the ZnO transparent electrode layer may have side surfaces inclined at a predetermined angle with respect to a surface perpendicular to the P-type compound semiconductor layer. Accordingly, the luminous efficiency of the light emitting diode can be enhanced.

A method of fabricating a light emitting device according to another aspect of the present invention comprises growing an N-type compound semiconductor layer, an active layer and a P-type compound semiconductor layer on a P-type silicon substrate having a zener diode region and a light emitting diode region. The P-type compound semiconductor layer, the active layer and the N-type compound semiconductor layer are patterned using photolithographic and etching processes. By means of the patterning processes, first N-type compound semiconductor layer of which a top surface is exposed is formed on the zener diode region, and a light emitting diode is formed on the light emitting diode region. The P-type silicon substrate and the first N-type compound semiconductor layer have characteristics of a zener diode, and the light emitting diode includes a second N-type compound semiconductor layer spaced apart from the first N-type compound semiconductor layer, a P-type compound semiconductor layer positioned on the second N-type compound semiconductor layer, and an active layer interposed between the P-type compound semiconductor layer and the second N-type compound semiconductor layer. Accordingly, a light emitting device with a zener diode and a light emitting diode formed in a single chip is fabricated, and thus, processes of fabricating and mounting an additional zener diode for preventing electrostatic discharge can be omitted.

The silicon substrate may be a porous silicon substrate. The porous silicon substrate may be provided using an anodization technique.

Meanwhile, a transparent electrode layer defined on the light emitting diode may be formed. The transparent electrode layer defined on the light emitting diode may be formed on the P-type compound semiconductor layer of the light emitting diode after the light emitting diode has been formed. Alternatively, the transparent electrode layer defined on the light emitting diode may be formed by forming a transparent electrode layer on the P-type compound semiconductor layer before patterning the P-type compound semiconductor layer, the active layer and the N-type compound semiconductor layer; and patterning the transparent electrode layer formed on the P-type compound semiconductor layer so as to be defined in the light emitting diode region. At this time, the transparent electrode layer may be formed of ZnO. The ZnO transparent electrode layer may be patterned to have side surfaces inclined at a predetermined angle with respect to a surface perpendicular to the P-type compound semiconductor layer of the light emitting diode. Accordingly, it is possible to provide a light emitting device with uniform light distribution and enhanced luminous efficiency.

According to embodiments of the present invention, it is possible to provide a light emitting device that has a light emitting diode and a zener diode in a single chip and can achieve a high output power by employing a silicon substrate with superior heat dissipation performance. Further, since a ZnO transparent electrode layer is employed, the transparent electrode layer can be formed to be relatively thick, and thus, the configuration of a light emitting surface can be variously designed. Accordingly, it is possible to provide a light emitting device having enhanced luminous efficiency and uniform light distribution by reducing a light loss caused by total internal reflection.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 1:
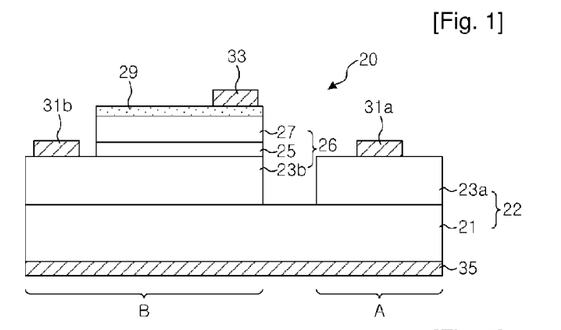
FIG. 1 is a sectional view illustrating a light emitting device according to an embodiment of the present invention.

FIG. 1 is a sectional view illustrating a light emitting device 20 according to an embodiment of the present invention.

Referring to FIG. 1, a P-type silicon substrate 21 has a zener diode region A and a light emitting diode region B. The silicon substrate 21 may be a porous silicon substrate.

Meanwhile, a first N-type compound semiconductor layer 23*a* is positioned on the zener diode region A. The first N-type compound semiconductor layer 23*a* and the P-type silicon substrate 21 are subjected to p-n junction to form a zener diode 22. Further, a second N-type compound semiconductor layer 23*b* is positioned on the light emitting diode region B of the P-type silicon substrate 21. The second N-type compound semiconductor layer 23*b* is spaced apart from the first N-type compound semiconductor layer 23*a*. The first and second N-type compound semiconductor layers 23*a* and 23*b* may be formed of the same N-type compound semiconductor layer grown on the P-type silicon substrate 21. That is, the first and second N-type compound semiconductor layers 23*a* and 23*b* may be formed by dividing the N-type compound semiconductor layer grown on the P-type silicon substrate 21.

The P-type silicon substrate 21 is generally used in a semiconductor fabrication process. The P-type silicon substrate 21 may be provided to have a size larger than that of a sapphire substrate and is inexpensive. Meanwhile, a porous silicon substrate may be provided by anodizing the silicon substrate. Accordingly, the porous silicon substrate has a porous silicon layer (not shown) on a top surface thereof. Further, P-type impurities may be additionally doped into the P-type silicon substrate 21 using an ion injection technique such as implantation. Meanwhile, each of the first and second N-type compound semiconductor layers 23 may be formed of an (Al, In, Ga)N compound semiconductor.

A P-type compound semiconductor layer 27 is positioned on the second N-type compound semiconductor layer 23b, and an active layer 25 is interposed between the second N-type compound semiconductor layer 23b and the P-type compound semiconductor layer 27. The active layer 25 may be a single quantum well formed as a single layer or a multi-quantum well with a laminated structure. Each of the active layer 25 and the P-type compound semiconductor layer 27 may be formed of an (Al, In, Ga)N compound semiconductor layer. As shown in this figure, the P-type compound semiconductor layer 27 may be positioned on one region of the second N-type compound semiconductor layer 23b, and the other region thereof may be exposed.

The N-type compound semiconductor layer 23b, the active layer 25 and the P-type compound semiconductor layer 27 constitute a light emitting diode 26.

A transparent electrode layer 29 is formed on the P-type compound semiconductor layer 27. The transparent electrode layer 29 may be formed of a transparent metal such as indium tin oxide (ITO) or Ni/Au.

Additionally, N-type electrode pads 31a and 31b are formed on the first and second N-type compound semiconductor layers 23a and 23b, respectively. A P-type electrode pad 33 is formed on the transparent electrode layer 29. The electrode pads 31a, 31b and 33 are used as contact pads for electrically connecting the zener diode 22 and the light emitting diode 26 to an external circuit. In addition, an electrode pad 35 may be formed on a bottom surface of the P-type silicon substrate 21.

According to this embodiment, the light emitting diode 26 is formed on the P-type silicon substrate 21 or P-type porous silicon substrate, so that heat generated from the light emitting diode 26 can be easily dissipated. Further, since the light emitting device according to this embodiment has the zener diode 22 therein, it is possible to prevent damage due to electrostatic discharge. Accordingly, since a conventional zener diode mounted together with a light emitting device can be omitted, the number of processes of fabricating a package and fabrication costs thereof can be reduced.

Figure 2:
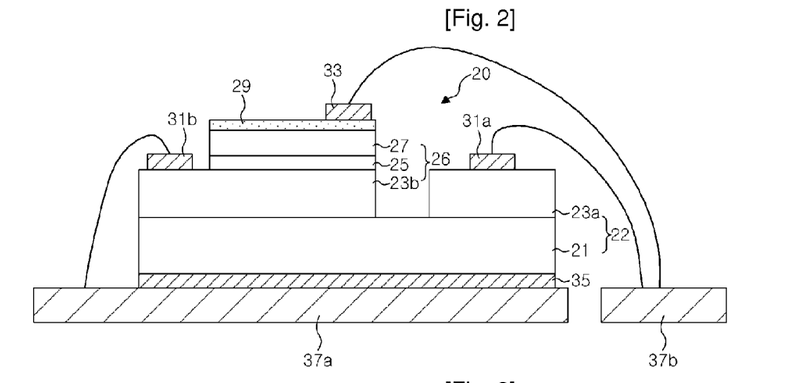
FIG. 2 is a sectional view showing an example of a light emitting diode package having the light emitting device mounted thereon according to the embodiment of the present invention.
Figure 3:
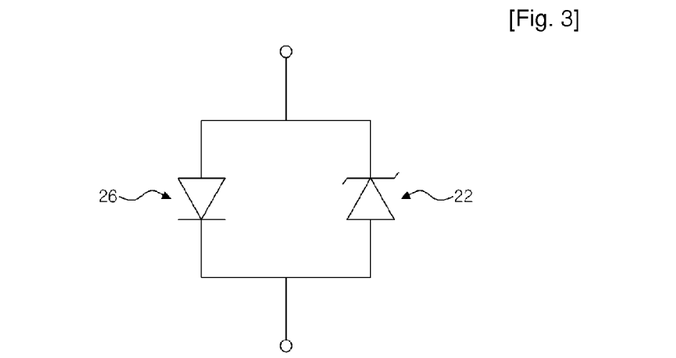
FIG. 3 is an equivalent circuit diagram of the light emitting diode package of FIG. 2.

FIG. 2 is a sectional view showing an example of a light emitting diode package having the light emitting device mounted thereon according to the embodiment of the present invention, and FIG. 3 is an equivalent circuit diagram of the light emitting diode package of FIG. 2.

Referring to FIG. 2, the light emitting diode package comprises leads 37a and 37b for electrically connecting the light emitting device 20 to an external power source. The light emitting device 20 is die-bonded to the lead 37a, and thus, the silicon substrate 21 is electrically connected to the lead 37a.

Meanwhile, the N-type and P-type electrode pads 31a and 33 respectively positioned on the zener diode 22 and the light emitting diode 26 are electrically connected to the lead 37b through bonding wires. The N-type electrode pad 31b formed on the light emitting diode 26 is electrically connected to the lead 37a through a bonding wire. Accordingly, the light emitting diode 26 and the zener diode 22 are connected in reverse parallel to each other as shown in FIG. 3.

When a forward voltage is applied by connecting the leads 37a and 37b to a power source, the forward voltage is applied to the light emitting diode 26 so that light is emitted. Meanwhile, the zener diode 22 prevents the forward voltage applied to the light emitting diode 26 from being excessively increased so that the light emitting diode 26 is prevented from being damaged due to an over voltage. A breakdown voltage of the zener diode 22 may be controlled by adjusting a doping concentration of the P-type silicon substrate 21 and/or a doping concentration of the first N-type compound semiconductor layer 23a.

Figure 4:
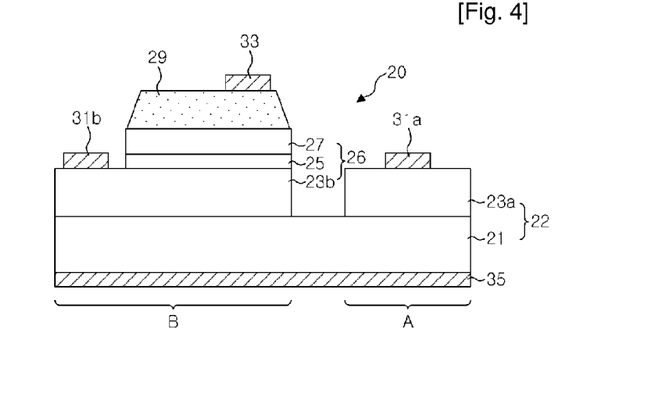
FIG. 4 is a sectional view illustrating a light emitting device according to another embodiment of the present invention.
Figure 5:
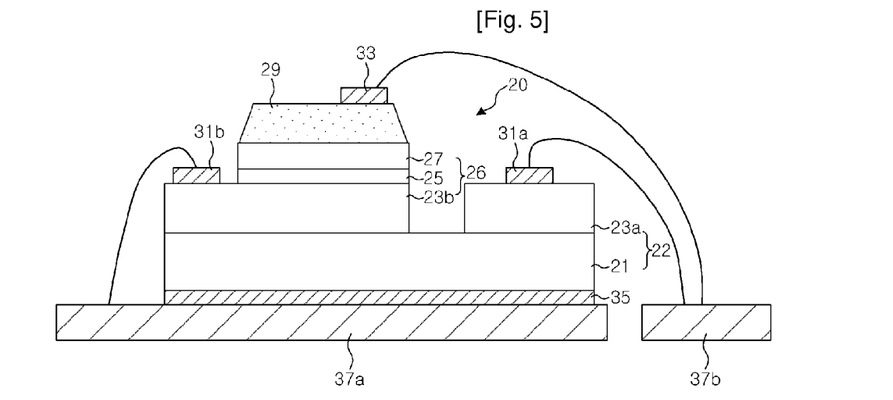
FIG. 5 is a sectional view showing an example of a light emitting diode package having the light emitting device mounted thereon according to the other embodiment of the present invention.

FIG. 4 is a sectional view illustrating a light emitting device according to another embodiment of the present invention, and FIG. 5 is a sectional view showing an example of a light emitting diode package having the light emitting device mounted thereon according to the other embodiment of the present invention.

Referring to FIG. 4, a P-type silicon substrate 21 has a zener diode region A and a light emitting diode region B and may be a porous silicon substrate, as described above with reference to FIG. 1. A first N-type compound semiconductor layer 23a is positioned on the zener diode region A. The first N-type compound semiconductor layer 23a and the P-type silicon substrate 21 are subjected to p-n junction to form a zener diode 22. Further, a second N-type compound semiconductor layer 23b is positioned on the light emitting diode region B of the P-type silicon substrate 21 while being spaced apart from the first N-type compound semiconductor layer 23a. A P-type compound semiconductor layer 27 is positioned on the second N-type compound semiconductor layer 23b, and an active layer 25 is interposed between the second N-type compound semiconductor layer 23b and the P-type compound semiconductor layer 27. The active layer 25 may be a single quantum well formed as a single layer or a multi-quantum well with a laminated structure. As described with reference to FIG. 1, the P-type compound semiconductor layer 27 may be positioned on one region of the second N-type compound semiconductor layer 23b, and the other region thereof may be exposed. The N-type compound semiconductor layer 23b, the active layer 25 and the P-type compound semiconductor layer 27 constitute a light emitting diode 26.

Meanwhile, a ZnO transparent electrode layer 29 is formed on the P-type compound semiconductor layer 27. The ZnO transparent electrode layer 29 may be formed by means of molecular beam epitaxy, metal organic chemical vapor deposition or the like. The ZnO transparent electrode layer 29 comes into ohmic contact with the P-type compound semiconductor layer 27. To this end, a general technical means such as a highly doped tunnel layer (not shown) may be employed.

ZnO is a metal oxide with superior etching selectivity, light transmittance and electrical properties. Thus, the ZnO transparent electrode layer 29 may be formed to be relatively thicker than Ni/Au and indium tin oxide (ITO), and accordingly, may be formed in various configurations to enhance a light emitting property. As shown in these figures, the ZnO transparent electrode layer 29 may be formed, for example, to have a configuration with a section gradually narrowing in a light emitting direction, i.e., such that its side surfaces are inclined at a predetermined angle with respect to a surface perpendicular to the P-type compound semiconductor layer 27. The configuration of the transparent electrode layer 29 prevents light from being lost due to total internal reflection or from being concentrated near an upper edge of the light emitting diode 26. Accordingly, the luminous efficiency of the light emitting diode 26 is enhanced, and the light emitting diode 26 can emit light of uniform distribution.

In addition, N-type electrode pads 31a and 31b are formed on the first and second N-type compound semiconductor layers 23a and 23b, respectively. A P-type electrode pad 33 is formed on the ZnO transparent layer 29. The electrode pads 31a, 31b and 33 are used as contact pads for electrically connecting the zener diode 22 and the light emitting diode 26 to an external circuit. Further, an electrode pad 35 may be formed on a bottom surface of the P-type silicon substrate 21.

According to this embodiment, it is possible to provide a light emitting device with uniform light distribution and enhanced luminous efficiency by employing the ZnO transparent electrode layer 29.

Referring to FIG. 5, the light emitting diode package comprises leads 37a and 37b for electrically connecting the light emitting device 20 to an external power source as described with reference to FIG. 2. The light emitting device 20 is die-bonded to the lead 37a, and thus, the silicon substrate 21 is electrically connected to the lead 37a.

Meanwhile, the N-type and P-type electrode pads 31a and 33 respectively positioned on the zener diode 22 and the light emitting diode 26 are electrically connected to the lead 37b through bonding wires. The N-type electrode pad 31b formed on the light emitting diode 26 is electrically connected to the lead 37a through a bonding wire. Accordingly, the light emitting diode 26 and the zener diode 22 are connected in reverse parallel to each other as shown in FIG. 3. As described with reference to FIG. 2, when a forward voltage is applied by connecting a power source to the leads 37a and 37b, the forward voltage is applied to the light emitting diode 26 so that light is emitted. Meanwhile, the zener diode 22 prevents the forward voltage applied to the light emitting diode 26 from being excessively increased so that the light emitting diode 26 is prevented from being damaged due to an over voltage.

Figure 6:
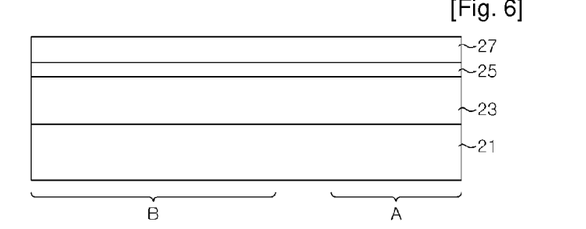
FIGS. 6 to 8 are sectional views illustrating a method of fabricating a light emitting device according to an embodiment of the present invention.
Figure 7:
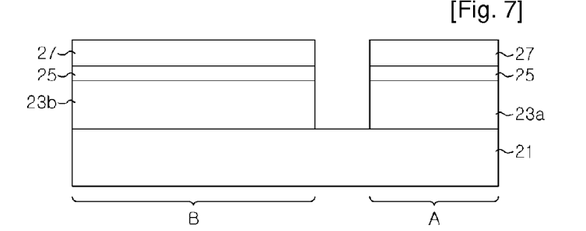
Figure 8:
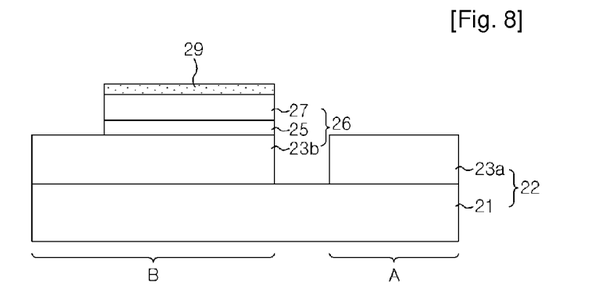

FIGS. 6 to 8 are sectional views illustrating a method of fabricating a light emitting device according to an embodiment of the present invention.

Referring to FIG. 6, an N-type compound semiconductor layer 23, an active layer 25 and a P-type compound semiconductor layer 27 are grown on a P-type silicon substrate 21 having a zener diode region A and a light emitting diode region B. The N-type compound semiconductor layer 23, the active layer 25 and the P-type compound semiconductor layer 27 may be grown on the P-type silicon substrate 21 using a metal organic chemical vapor deposition (MOCVD), hydride vapor phase epitaxy (HVPE) or molecular beam epitaxy (MBE) technique.

Before the N-type compound semiconductor layer 23 is grown, P-type impurities may be additionally doped into at least the zener diode region A of the P-type silicon substrate 21 by using an ion injection technique such as implantation.

Referring to FIG. 7, the P-type compound semiconductor layer 27, the active layer 25 and the N-type compound semiconductor layer 23 are patterned using photolithographic and etching processes, thereby dividing the layers 23, 25 and 27. Accordingly, first and second N-type compound semiconductor layers 23a and 23b respectively positioned on the zener diode region A and the light emitting diode region B are spaced apart from each other.

Referring to FIG. 8, the layers 23, 25 and 27 are patterned again, thereby removing portions of the P-type compound semiconductor layer 27 and the active layer 25 in the light emitting diode region B. As a result, the P-type compound semiconductor layer 27 and the active layer 25 remain on one region of the second N-type compound semiconductor layer 23b positioned on the light emitting region B, and a portion of the second N-type compound semiconductor layer 23b existing in the other region is exposed.

Meanwhile, the P-type compound semiconductor layer 27 and the active layer 25 on the zener diode region A are removed. The P-type compound semiconductor layer 27 and the active layer 25 on the zener diode region A may be simultaneously removed while the P-type compound semiconductor layer 27 and the active layer 25 on the light emitting diode region B are partially removed.

In the meantime, a transparent electrode layer 29 is formed on the P-type compound semiconductor layer 27. The transparent electrode layer 29 may be formed of indium tin oxide (ITO) or transparent metal such as Ni/Au using an e-beam evaporation or plating technique. Thereafter, N-type electrode pads (31a and 31b in FIG. 1) are formed on the exposed portions of the first and second N-type compound semiconductor layers 23a and 23b, respectively. A P-type electrode pad 33 is formed on the transparent electrode layer 29. Further, an electrode pad 35 may be formed on a bottom surface of the P-type silicon substrate 21. Accordingly, the light emitting device 20 of FIG. 1 is completed.

In this embodiment, it has been described that after the division into the first and second N-type compound semiconductor layers 23a and 23b is performed, the portions of the P-type compound semiconductor layer 27 and the active layer 25 on the light emitting diode region B and the portions of the P-type compound semiconductor layer 27 and the active layer 25 on the zener diode region A are removed. However, after the P-type compound semiconductor layer 27 and the active layer 25 are first patterned, the division into the first and second N-type compound semiconductor layers 23a and 23b may be performed.

Further, it has been described that the transparent electrode layer 29 is formed after patterning the P-type compound semiconductor layer 27. However, after the P-type compound semiconductor layer (27 in FIG. 6) is grown, the transparent electrode layer may be formed on the P-type compound semiconductor layer.

According to these embodiments, it is possible to fabricate a light emitting device having a zener diode 22 and a light emitting diode 26 in a single chip.

Figure 9:
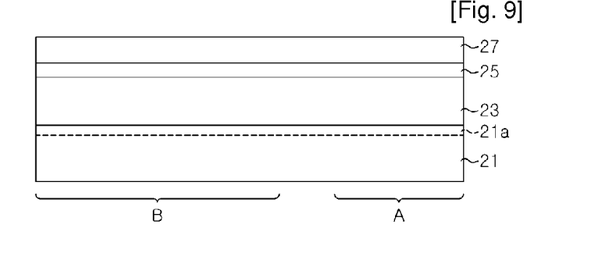
FIGS. 9 to 11 are sectional views illustrating a method of fabricating a light emitting device according to another embodiment of the present invention.
Figure 10:
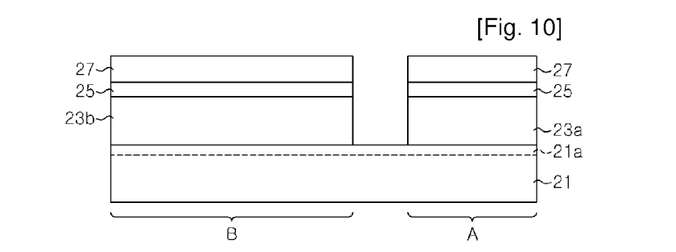
Figure 11:
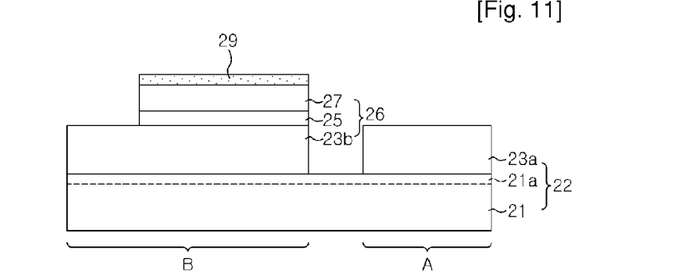

FIGS. 9 to 11 are sectional views illustrating a method of fabricating a light emitting device according to another embodiment of the present invention.

Referring to FIG. 9, a P-type porous silicon substrate having a zener diode region A and a light emitting diode region B is prepared. The P-type porous silicon substrate can be formed by anodizing a P-type silicon substrate. Accordingly, a porous silicon layer 21a is formed on a surface of the silicon substrate 21.

Anodization can be performed by applying a positive voltage to the P-type silicon substrate 21 in a hydrofluoric acid (HF) aqueous solution. For example, the aqueous solution may be an aqueous solution comprising HF, HCl or C2H5OH, and H2O. When a proper voltage is applied to the silicon substrate 21, pores are formed in the silicon substrate 21, thereby forming the porous silicon layer 21a. The size, shape, thickness and density of the pore are controlled by the concentration of HF, temperature, a substance doped into the silicon substrate 21, the degree of doping, an anode reaction time, the density of a supplied current, and the like. Such pores are formed while silicon is dissolved, and have a complicated structure.

Meanwhile, before performing the anodization, the surface of the P-type silicon substrate 21 may be partially etched with KOH. Thereafter, the anodization is performed to form the porous silicon layer 21a with uniform and high-density pores.

As described with reference to FIG. 6, an N-type compound semiconductor layer 23, an active layer 25 and a P-type compound semiconductor layer 27 are grown on the P-type porous silicon substrate 21. Further, before the N-type compound semiconductor layer 23 is grown, P-type impurities may be additionally doped into at least the zener diode region A of the P-type silicon substrate 21 using an ion injection technique such as implantation.

Referring to FIG. 10, the P-type compound semiconductor layer 27, the active layer 25 and the N-type compound semiconductor layer 23 are patterned using photolithographic and etching processes, thereby dividing the layers 23, 25 and 27, as described with reference to FIG. 7. Accordingly, first and second N-type compound semiconductor layers 23a and 23b respectively positioned on the zener diode region A and the light emitting diode region B are spaced apart from each other.

Referring to FIG. 11, the layers 23, 25 and 27 are patterned again, thereby removing portions of the P-type compound semiconductor layer 27 and the active layer 25 on the light emitting diode region B, as described with reference to FIG. 8. As a result, the P-type compound semiconductor layer 27 and the active layer 25 remain on one region of the second N-type compound semiconductor layer 23b positioned on the light emitting region B, and a portion of the second N-type compound semiconductor layer 23b existing in the other region is exposed. Further, the P-type compound semiconductor layer 27 and the active layer 25 on the zener diode region A are removed. The P-type compound semiconductor layer 27 and the active layer 25 on the zener diode region A may be simultaneously removed while the P-type compound semiconductor layer 27 and the active layer 25 on the light emitting diode region B are partially removed.

Further, a transparent electrode layer 29 is formed on the P-type compound semiconductor layer 29, as described with reference to FIG. 8. The transparent electrode layer 29 may be formed of indium tin oxide (ITO) or transparent metal such as Ni/Au using an e-beam evaporation or plating technique. Thereafter, N-type electrode pads (31a and 31b in FIG. 1) are formed on the exposed portions of the first and second N-type compound semiconductor layers 23a and 23b, respectively. A P-type electrode pad 33 is formed on the transparent electrode layer 29. Further, an electrode pad 35 may be formed on a bottom surface of the P-type silicon substrate 21.

In this embodiment, after the P-type compound semiconductor layer 27 and the active layer 25 are first patterned, the division into the first and second N-type compound semiconductor layers 23a and 23b may be performed. Further, after the P-type compound semiconductor layer (27 in FIG. 9) is grown, the transparent electrode layer 29 may be formed on the P-type compound semiconductor layer.

According to this embodiment, the heat dissipation performance of the light emitting device can be more enhanced by employing the porous silicon substrate.

Figure 12:
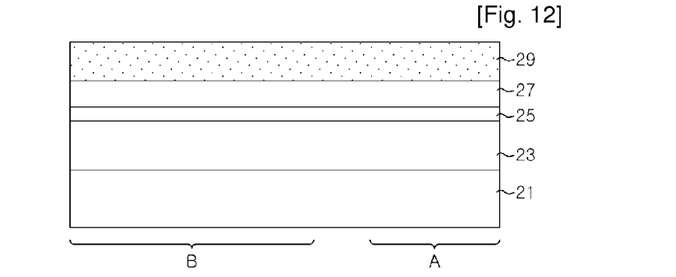
FIGS. 12 to 14 are sectional views illustrating a method of fabricating a light emitting device according to a further embodiment of the present invention.
Figure 13:
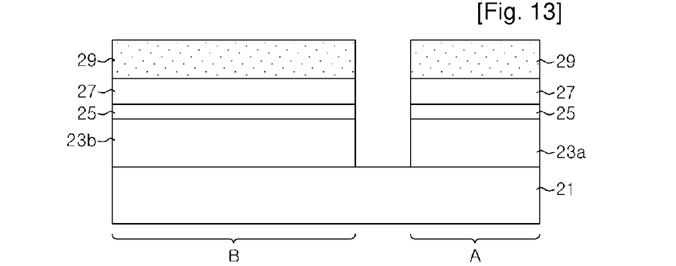
Figure 14:
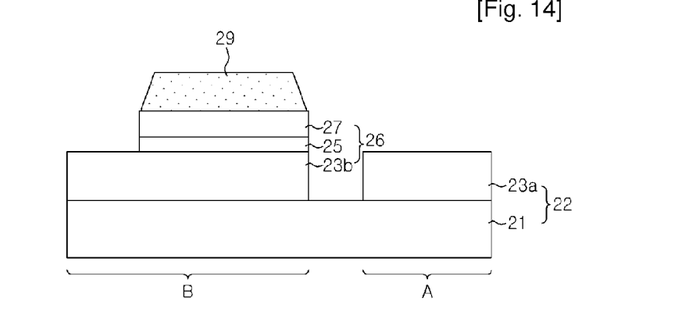

FIGS. 12 to 14 are sectional views illustrating a method of fabricating a light emitting device according to a further embodiment of the present invention.

Referring to FIG. 12, an N-type compound semiconductor layer 23, an active layer 25 and a P-type compound semiconductor layer 27 are grown on a P-type silicon substrate 21 having a zener diode region A and a light emitting diode region B, as described with reference to FIG. 4. As described with reference to FIG. 9, the silicon substrate 21 may be a porous silicon substrate. Further, before the N-type compound semiconductor layer 23 is grown, P-type impurities may be additionally doped into at least the zener diode region A of the P-type silicon substrate 21 using an ion injection technique such as implantation.

Meanwhile, a ZnO transparent electrode layer 29 is formed on the P-type compound semiconductor layer 27. The ZnO transparent electrode layer 29 may be formed using a molecular beam epitaxy or metal organic chemical vapor deposition technique. Since the ZnO transparent electrode layer 29 has an energy band gap similar to a GaN-based compound semiconductor layer, its light transmittance is excellent. Thus, the ZnO transparent electrode layer 29 may be formed to have a thickness larger than that of a transparent electrode layer such as Ni/Au or ITO. For example, the ZnO transparent electrode layer 29 may be formed to have a thickness of a few to a few tens microns.

Referring to FIG. 13, the ZnO transparent electrode layer 29, the P-type compound semiconductor layer 27, the active layer 25 and the N-type compound semiconductor layer 23 are patterned using photolithographic and etching processes, thereby dividing the layers 23, 25, 27 and 29. Accordingly, first and second N-type compound semiconductor layers 23a and 23b respectively positioned on the zener diode region A and the light emitting diode region B are spaced apart from each other.

Referring to FIG. 14, the layers 23, 25, 27 and 29 are patterned again, thereby removing portions of the ZnO transparent electrode layer 29, the P-type compound semiconductor layer 27 and the active layer 25 on the light emitting diode region B. As a result, the ZnO transparent electrode layer 29, the P-type compound semiconductor layer 27 and the active layer 25 remain on one region of the second N-type compound semiconductor layer 23b positioned on the light emitting region B, and a portion of the second N-type compound semiconductor layer 23b existing in the other region is exposed.

Meanwhile, the ZnO transparent electrode layer 29, the P-type compound semiconductor layer 27 and the active layer 25 on the zener diode region A are removed. The ZnO transparent electrode layer 29, the P-type compound semiconductor layer 27 and the active layer 25 on the zener diode region A may be simultaneously removed while the ZnO transparent electrode layer 29, the P-type compound semiconductor layer 27 and the active layer 25 on the light emitting diode region B are partially removed.

Subsequently, the ZnO transparent electrode layer 29 is patterned again to have a desired configuration in section. That is, side surfaces of the ZnO transparent electrode layer 29 may be formed to be inclined as shown in this figure. On the contrary, the ZnO transparent electrode layer 29 may be simultaneously patterned to have a predetermined configuration while the ZnO transparent electrode layer 29, the P-type compound semiconductor and the active layer 25 are partially removed to expose the second N-type compound semiconductor layer 23.

Thereafter, N-type pads (31a and 31b in FIG. 4) are formed on the exposed portions of the first and second N-type compound semiconductor layers 23a and 23b, respectively. A P-type electrode pad 33 is formed on the ZnO transparent electrode layer 29. Further, an electrode pad 35 may be formed on a bottom surface of the P-type silicon substrate 21. Accordingly, the light emitting device 20 of FIG. 4 is completed.

In this embodiment, it has been described that after the division into the first and second N-type compound semiconductor layers 23a and 23b is performed, the portions of the ZnO transparent electrode layer 29, the P-type compound semiconductor layer 27 and the active layer 25 on the light emitting diode region B, and the ZnO transparent electrode layer 29, the P-type compound semiconductor layer 27 and the active layer 25 on the zener diode region A are removed. However, after the ZnO transparent electrode layer 29, the P-type compound semiconductor layer 27 and the active layer 25 are first patterned, the division into the first and second N-type compound semiconductor layers 23a and 23b may be performed.

According to this embodiment, the configuration of a light emitting surface can be easily controlled by employing the ZnO transparent electrode layer 29.

The invention claimed is:

1. A light emitting device, comprising:
   a P-type silicon substrate having a zener diode region and a light emitting diode region;
   a first N-type compound semiconductor layer contacted to the zener diode region of the P-type silicon substrate to exhibit characteristics of a zener diode together with the P-type silicon substrate;
   a second N-type compound semiconductor layer positioned on the light emitting diode region of the P-type silicon substrate and spaced apart from the first N-type compound semiconductor layer;
   a P-type compound semiconductor layer positioned on the second N-type compound semiconductor layer; and
   an active layer interposed between the second N-type compound semiconductor layer and the P-type compound semiconductor layer.

2. The light emitting device as claimed in claim 1, wherein the silicon substrate is a porous silicon substrate.

3. The light emitting device as claimed in claim 2, wherein the porous silicon substrate is a substrate formed by anodizing a silicon substrate.

4. The light emitting device as claimed in claim 2, wherein the first and second N-type compound semiconductor layers are formed from an identical N-type compound semiconductor layer grown on the P-type silicon substrate.

5. The light emitting device as claimed in claim 2, wherein the P-type compound semiconductor layer is positioned on one region of the second N-type compound semiconductor layer, and the other region thereof is exposed.

6. The light emitting device as claimed in claim 2, further comprising a transparent electrode layer positioned on the P-type compound semiconductor layer.

7. The light emitting device as claimed in claim 1, wherein the first and second N-type compound semiconductor layers are formed from an identical N-type compound semiconductor layer grown on the P-type silicon substrate.

8. The light emitting device as claimed in claim 1, wherein the P-type compound semiconductor layer is positioned on one region of the second N-type compound semiconductor layer, and the other region thereof is exposed.

9. The light emitting device as claimed in claim 1, further comprising a transparent electrode layer positioned on the P-type compound semiconductor layer.

10. The light emitting device as claimed in claim 9, wherein the transparent electrode layer is formed of indium tin oxide (ITO) or Ni/Au.

11. The light emitting device as claimed in claim 9, wherein the transparent electrode layer is formed of ZnO.

12. The light emitting device as claimed in claim 11, wherein the ZnO transparent electrode layer has side surfaces inclined at a predetermined angle with respect to a surface perpendicular to the P-type compound semiconductor layer.

13. The light emitting device as claimed in claim 9, further comprising electrode pads respectively formed on the first and second N-type compound semiconductor layers and the transparent electrode layer.

14. A method of fabricating a light emitting device, comprising:
    growing an N-type compound semiconductor layer, an active layer and a P-type compound semiconductor layer on a P-type silicon substrate having a zener diode region and a light emitting diode region; and
    patterning the P-type compound semiconductor layer, the active layer and the N-type compound semiconductor layer using photolithographic and etching processes to form a first N-type compound semiconductor layer of which a top surface is exposed on the zener diode region and to form a light emitting diode on the light emitting diode region,
    wherein the P-type silicon substrate and the first N-type compound semiconductor layer have characteristics of a zener diode, and the light emitting diode includes a second N-type compound semiconductor layer spaced apart from the first N-type compound semiconductor layer, a P-type compound semiconductor layer positioned on the second N-type compound semiconductor layer, and an active layer interposed between the P-type compound semiconductor layer and the second N-type compound semiconductor layer.

15. The method as claimed in claim 14, wherein the silicon substrate is a porous silicon substrate.

16. The method as claimed in claim 15, further comprising:
    forming a transparent electrode layer defined on the light emitting diode.

17. The method as claimed in claim 14, further comprising:
    forming a transparent electrode layer defined on the light emitting diode.

18. The method as claimed in claim 17, wherein forming the transparent electrode layer defined on the light emitting diode comprises:
    forming a transparent electrode layer on the P-type compound semiconductor layer before patterning the P-type compound semiconductor layer, the active layer and the N-type compound semiconductor layer; and
    patterning the transparent electrode layer formed on the P-type compound semiconductor layer to be defined in the light emitting diode region.

19. The method as claimed in claim 18, wherein the transparent electrode layer is formed of ZnO.

20. The method as claimed in claim 19, wherein the ZnO transparent electrode layer is patterned to have side surfaces inclined at a predetermined angle with respect to a surface perpendicular to the P-type compound semiconductor layer of the light emitting diode.

* * * * *